US011875993B2

(12) United States Patent
Kim et al.

(10) Patent No.: US 11,875,993 B2
(45) Date of Patent: Jan. 16, 2024

(54) LOW WARP FAN-OUT PROCESSING METHOD AND PRODUCTION OF SUBSTRATES THEREFOR

(71) Applicant: CORNING INCORPORATED, Corning, NY (US)

(72) Inventors: Jin Su Kim, Seoul (KR); Yu Xiao, Pittsford, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 17/967,354

(22) Filed: Oct. 17, 2022

(65) Prior Publication Data

US 2023/0044556 A1  Feb. 9, 2023

Related U.S. Application Data

(63) Continuation of application No. 16/916,385, filed on Jun. 30, 2020, now Pat. No. 11,508,575.
(Continued)

(51) Int. Cl.
*H01L 21/02* (2006.01)
*C03B 33/07* (2006.01)

(52) U.S. Cl.
CPC ...... *H01L 21/02422* (2013.01); *C03B 33/076* (2013.01)

(58) Field of Classification Search
CPC ...... H01L 2924/3511; H01L 21/02422; H05K 1/0271; H05K 2201/068
See application file for complete search history.

(56) References Cited

U.S. PATENT DOCUMENTS 8,012,807 B2  9/2011  Meyer et al.
8,497,587 B2  7/2013  Ma
(Continued)

FOREIGN PATENT DOCUMENTS

CN  106057787 A  10/2016
KR  10-1393700 B1  5/2014
(Continued)

OTHER PUBLICATIONS

Amy Palesko Lujan, "A Cost Analysis of RDL-first and Mold-first Fan-out Wafer Level Packaging", Proceedings of International Conference Electronics Packaging 2016, pp. 237-242.
(Continued)

*Primary Examiner* — John A Bodnar
(74) *Attorney, Agent, or Firm* — Daniel J. Greenhalgh

(57) ABSTRACT

A method of fan-out processing includes providing or obtaining a fused glass laminate sheet or wafer having a core layer and a first clad layer and a second clad layer, the core layer comprising a core glass having a core glass coefficient of thermal expansion $\alpha_{core}$, the first clad layer and the second clad layer each comprising a clad glass having a clad glass coefficient of thermal expansion $\alpha_{clad}$, where $\alpha_{clad} > \alpha_{core}$; affixing integrated circuit devices to the second clad layer of the laminate sheet or wafer; forming a fan-out layer on or above the integrated circuit devices; and removing some of the first clad layer to decrease warp of the sheet or wafer with integrated circuit devices and a fan-out layer thereon. A method of producing a laminate sheet or wafer having a selected CTE is also disclosed.

10 Claims, 4 Drawing Sheets

Related U.S. Application Data

(60) Provisional application No. 62/893,865, filed on Aug. 30, 2019, provisional application No. 62/881,359, filed on Jul. 31, 2019, provisional application No. 62/868,997, filed on Jun. 30, 2019.

(56) References Cited

U.S. PATENT DOCUMENTS

| | | |
|---|---|---|
| 8,535,978 B2 | 9/2013 | Scanlan |
| 8,836,780 B2 | 9/2014 | Weiss et al. |
| 9,754,924 B2 | 9/2017 | Chung |
| 9,837,376 B2 | 12/2017 | Kim et al. |
| 2015/0318267 A1 | 11/2015 | Tsai et al. |
| 2016/0268236 A1 | 9/2016 | Chung |

FOREIGN PATENT DOCUMENTS

| | | |
|---|---|---|
| KR | 10-1393701 B1 | 5/2014 |
| WO | 2017/196800 A1 | 11/2017 |

OTHER PUBLICATIONS

Azemar et al., "Fan-out packaging: What can explain such a great potential?" Chip Scale Review, May/Jun. 2015, 5-8.

Chueh An Hsieh et al., "Ultra-thin PoP Solution Using Wafer Level Fan-out Technologies", Proceedings of Electronic SystemIntegration Technology Conference 2016, pp. 1-5.

Fan-out wafer-level packaging extending the platform. Chip Scale Review Mar./Apr. 2013, 36-41.

G. Sharma et al., "Performance & Reliability Characterization of eWLB (embedded Wafer Level BGA) Packaging", Proceedings of 12 th Electronics Packaging Technology Conference 2010, pp. 211-216.

Interposers: What's different this time around. Chip Scale Review Mar./Apr. 2013, 9-10.

Favier Shoo, "Fan-Out Packaging 2019: Technologies & Market Trends," available at https://www.slideshare.net/Yole_Developpement/fanout-packaging-technologies-and-market-trends-2019-129235111, 2019.

Ikeser et al., "Advanced packaging: The redistributed chip package", IEEE Transactions on Advanced Packaging, vol. 31, 2008, pp. 39-43.

Lee et al., "Numerical analysis of warpage and reliability of fan-out wafer-level package", Journal of the Microelectronics & Packaging Society, vol. 21, 2014, pp. 31-39.

Meyer et al., "Embedded wafer-level ball grid array (eWLB)", 10th Electronics Packaging Technology Conference, 2008, pp. 994-998.

Jerome Azemar, "Fan-Out Wafer-Level-Packaging: Market and Technology Trends," IMAPS 2016—49th International Symposium on Microelectronics—Pasadena, CA USA—Oct. 10-13, 2016.

Shorey et al., "Glass substrates for carrier and interposer applications and associated metrology solutions", Advanced Semiconductor Manufacturing Conference 2013, pp. 142-147.

Takekoshi et al., "Warpage suppression during FO-WLP fabrication process", IEEE 67th Electronic Components and Technology Conference, 2017, pp. 902-908.

Tseng et al., "InFO (wafer Level Integrated Fan-Out) Technology", Proceedings of 66 th Electronic Components and Technology Conference, 2016, pp. 1-6.

WLPs in an OSAT world: The top ten OSAT WLP assemblers. Chip Scale Review, (Mar./Apr. 2013, pp. 24-26.

Xuejun Fan, "Wafer Level Packaging (WLP): Fan-in, Fan-out and Three-Dimensional Integration", 11th. Int. Conf. on Thermal Mechanical and Multiphysics Simulation and Experiments in Micro-Electronics and Micro-Systems, 2010, pp. 1-7.

Yoon et al., "3D eWLB (embedded wafer level BGA) Technology for 3D-Packaging/3D-SiP (Systems-in-Package)applications", 11th Electronics Packaging Technology Conference, 2009.

LOW WARP FAN-OUT PROCESSING METHOD AND PRODUCTION OF SUBSTRATES THEREFOR

CROSS-REFERENCE TO RELATED APPLICATIONS

This application is a continuation of Ser. No. 16/916,385 filed Jun. 30, 2020, which claims the benefit of priority under 35 U.S.C. § 119 of U.S. Provisional Application No. 62/868,997, filed Jun. 30, 2019; U.S. Provisional Application No. 62/881,359 filed Jul. 31, 2019; and U.S. Provisional Application No. 62/893,865 filed Aug. 30, 2019, the content of each of which is incorporated herein by reference in its entirety.

FIELD OF THE DISCLOSURE

The disclosure relates to methods for low warp fan-out processing, particularly for fan-out processing using a fused laminated glass substrate having a core layer between first and second clad layers, the process including forming fan-out layers supported on the first clad layer and removing at least some of (thinning) the second clad layer, and to methods for preparing laminated glass substrates, useful for such processing, having desired coefficients of thermal expansion.

BACKGROUND

In the recent past, fan-out wafer level packaging (FO-WLP) and fan-out panel level packaging (FO-PLP) have gotten significant attention in the IC packaging technology arena for their high-degree heterogeneous integration capability, small form factor, and total reduced system cost. With significant adoption of TSMC's "InFO" (integrated fan out) FO-WLP solution, fan-out packaging has gone from core fan-out applications such as baseband, power management, and RF transceivers to more advanced high density fan-out applications such as APEs.

Top challenges today with fan-out packaging include (1) in-process warpage and (2) die shift.

To keep the in-process warpage within specification, a carrier with an optimized coefficient of thermal expansion (CTE) is desirable. The precise CTE desired depends on many factors, including chip design, the layout of the reconstituted wafer/panel, and the RDL/bump process. Availability of glass substrates with CTEs spaced in 0.1 ppm/° C. increments over a wide range are sought by manufacturers.

Corning's laminated fusion drawn glass process potentially provides a capability for glass production with a continuous spectrum of CTEs by changing the core to clad thickness ratio of the fused laminated sheets and/or by varying the composition of the core and/or clad of the sheets. However, it is costly to vary the composition and/or the thickness ratio in small increments, and some ratios and compositions are outside the capabilities of the laminated fusion drawn glass process or machine. A practical and cost-efficient way to make glass carriers with a fine granularity of selectable CTEs is desirable.

Further, even when starting with a carrier substrate having a CTE well matched to the circuits being packaged, there can still be significant warp induced during fan-out processing (defined as the process of manufacturing the fan-out packaging), since the effective CTE of the layers bonded to the carrier (all on one side of the carrier) and the resulting stress in these layers after deposition is constantly changing with each consecutive process, such as bonding, EMC curing, grinding, multiple alternating polymer and copper depositions, bump plating and ball attaching. The desired CTE of the carrier is generally selected such that the warp induced at any point during the whole process can fall into an acceptable range; but warp is not minimized at each step, or several steps, individually.

To reduce the warpage across the whole process, either stiffer or thicker carrier has to be used. However, due to the technology being used or the manufacturing limits, these solutions may not be feasible. For example, due to its high Young's modulus, glass ceramics may seem to be a good replacement of glass, but they usually have relative low CTEs and transparency may also be an issue since laser de-bonding has become the prevalent de-bonding method in die-up fan-out packaging. Currently >70% transparency at visible light is generally required for laser de-bonding. And newer technologies may require some transparency even in the deep UV range. Similarly, thicker glass carriers can certainly reduce warp. However, a thicker glass means more weight and thus more powerful vacuum chuck is needed, and more significantly, higher stress is produced in the semiconductor layers. Accordingly, there is a maximum thickness that manufacturers are willing or able to accept. An alternative method to minimize warp over all or several steps would be desirable.

SUMMARY OF THE DISCLOSURE

According to some aspects of the present disclosure, a method is provided which method comprises providing or obtaining a fused glass laminate sheet having a core layer and a first clad layer and a second clad layer, the core layer having a core thickness $t_{core}$ and comprising a core glass having a core glass coefficient of thermal expansion $\alpha_{core}$, a core glass Poisson's ratio $v_{core}$, and a core glass elasticity $E_{core}$, the first clad layer (34) and the second clad layer (36) each having a thickness $t_{clad}$ and comprising a clad glass having a clad glass coefficient of thermal expansion $\alpha_{clad}$, a clad glass Poisson's ratio $v_{clad}$, and a clad glass elasticity $E_{clad}$. The method 100 further comprises the step 120 of selecting or specifying a desired effective coefficient of thermal expansion $\alpha_{eff}$ greater than $$\frac{\frac{2t_{clad}E_{clad}}{1-v_{clad}}\alpha_{clad} + \frac{t_{core}E_{core}}{1-v_{core}}\alpha_{core}}{\frac{2t_{clad}E_{clad}}{1-v_{clad}} + \frac{t_{core}E_{core}}{1-v_{core}}}$$

and less than $\alpha_{core}$.

The method further comprises thinning the first clad layer and the second clad layer to produce thinned first clad layer and a thinned second clad layer each having a thinned thickness $t_{thinned}$ within the range of from $$\frac{\frac{t_{core}E_{core}}{1-v_{core}}\alpha_{core} - \frac{\alpha_{eff}t_{core}E_{core}}{1-v_{core}}}{\frac{\alpha_{eff}2E_{clad}}{1-v_{clad}} - \frac{2E_{clad}}{1-v_{clad}}\alpha_{clad}} \cdot (1-P)$$

to

-continued $$\frac{\frac{t_{core}E_{core}}{1-v_{core}}\alpha_{core} - \frac{\alpha_{eff}t_{core}E_{core}}{1-v_{core}}}{\frac{\alpha_{eff}2E_{clad}}{1-v_{clad}} - \frac{2E_{clad}}{1-v_{clad}}\alpha_{clad}} \cdot (1+P)$$

where P is 0.1, 0.05, 0.02, 0.01, or even 0.05. This method can relatively economically produce a carrier substrate having any desired CTE within the range of from $$\frac{\frac{2t_{clad}E_{clad}}{1-v_{clad}}\alpha_{clad} + \frac{t_{core}E_{core}}{1-v_{core}}\alpha_{core}}{\frac{2t_{clad}E_{clad}}{1-v_{clad}} + \frac{t_{core}E_{core}}{1-v_{core}}} \text{ to } \alpha_{core}.$$

In further embodiments of this method, the core layer consists essentially of the core glass. In additional further embodiments, the first clad layer and the second clad layer each consist essentially of the clad glass.

In still further embodiments, the step of providing or obtaining a fused glass laminate sheet comprises producing the fused glass laminate sheet using a fusion draw machine.

In still other embodiments, the step of thinning the first clad layer and the second clad layer comprises etching the first clad layer and the second clad layer.

In yet other embodiments, the step of thinning the first clad layer and the second clad layer comprises polishing the first clad layer and the second clad layer.

According to further embodiments, the method further comprises the step of cutting the fused glass laminate sheet to form one or more wafers.

According to still further embodiments, the method comprises the step of cutting the fused glass laminate sheet to form one or more panels.

According to yet further embodiments, cutting comprises laser cutting.

According to additional further embodiments, cutting comprises laser cutting using a Bessel beam.

According to additional aspects of the present disclosure, a method of fan-out processing includes providing or obtaining a fused glass laminate sheet or wafer (12) having a core layer (32) and a first clad layer (34) and a second clad layer (36), the core layer (32) comprising a core glass having a core glass coefficient of thermal expansion αcore, the first clad layer (34) and the second clad layer (36) each comprising a clad glass having a clad glass coefficient of thermal expansion αclad, where αclad>αcore; affixing integrated circuit devices (42) to the second clad layer (36) of the laminate sheet or wafer; forming a fan-out layer (46) on or above the integrated circuit devices (42); and removing some of the first clad layer (34) to decrease warp of the sheet or wafer with integrated circuit devices and a fan-out layer thereon.

According to embodiments of this method, the core layer consists essentially of the core glass. Similarly, according to embodiments, the second clad layer each consist essentially of the clad glass.

According to embodiments, the step of providing or obtaining a fused glass laminate sheet or wager comprises producing the fused glass laminate using a fusion draw machine.

According to embodiments, the step of thinning the first clad layer comprises etching the first clad layer.

According to embodiments, the step of thinning the first clad layer comprises polishing or grinding the first clad layer.

According to embodiments, the method additionally comprises selecting the effective CTE of the laminate sheet or wafer to be within 20%, or 10%, of the ideal CTE for the die bonding and filling processes only.

According to embodiments, the method additionally comprises forming an additional fan-out layer on or above the first fan-out layer and removing more of the first clad layer.

According to embodiments, the step of selecting the effective CTE of the laminate sheet or wafer additionally comprises providing or obtaining a fused glass laminate having a core layer (32) and a first clad layer (34) and a second clad layer (36), the core layer (32) having a core thickness $t_{core}$ and comprising a core glass having a core glass coefficient of thermal expansion $\alpha_{core}$, a core glass Poisson's ratio $v_{core}$, and a core glass elasticity $E_{core}$, the first clad layer (34) and the second clad layer (36) each having a thickness $t_{clad}$ and comprising a clad glass having a clad glass coefficient of thermal expansion $\alpha_{clad}$, a clad glass Poisson's ratio $v_{clad}$, and a clad glass elasticity $E_{clad}$, selecting a desired effective coefficient of thermal expansion $\alpha_{eff}$ greater than $$\frac{\frac{2t_{clad}E_{clad}}{1-v_{clad}}\alpha_{clad} + \frac{t_{core}E_{core}}{1-v_{core}}\alpha_{core}}{\frac{2t_{clad}E_{clad}}{1-v_{clad}} + \frac{t_{core}E_{core}}{1-v_{core}}}$$

and less than $\alpha_{core}$, and thinning the first clad layer (34) and the second clad layer (36) to produce thinned first clad layer (34a) and a thinned second clad layer (36a) each having a thickness $t_{thinned}$ within the range of from $$\frac{\frac{t_{core}E_{core}}{1-v_{core}}\alpha_{core} - \frac{\alpha_{eff}t_{core}E_{core}}{1-v_{core}}}{\frac{\alpha_{eff}2E_{clad}}{1-v_{clad}} - \frac{2E_{clad}}{1-v_{clad}}\alpha_{clad}} \cdot (1-P)$$

to $$\frac{\frac{t_{core}E_{core}}{1-v_{core}}\alpha_{core} - \frac{\alpha_{eff}t_{core}E_{core}}{1-v_{core}}}{\frac{\alpha_{eff}2E_{clad}}{1-v_{clad}} - \frac{2E_{clad}}{1-v_{clad}}\alpha_{clad}} \cdot (1+P)$$

where P is 0.1, 0.05, 0.02, 0.01, or even 0.05.

Additional features and advantages will be set forth in the detailed description which follows, and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the disclosure and the appended claims.

The accompanying drawings are included to provide a further understanding of principles of the disclosure, and are incorporated in, and constitute a part of, this specification. The drawings illustrate one or more embodiment(s) and, together with the description, serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the following embodiments.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION OF THE PREFERRED EMBODIMENTS

Figure 1:
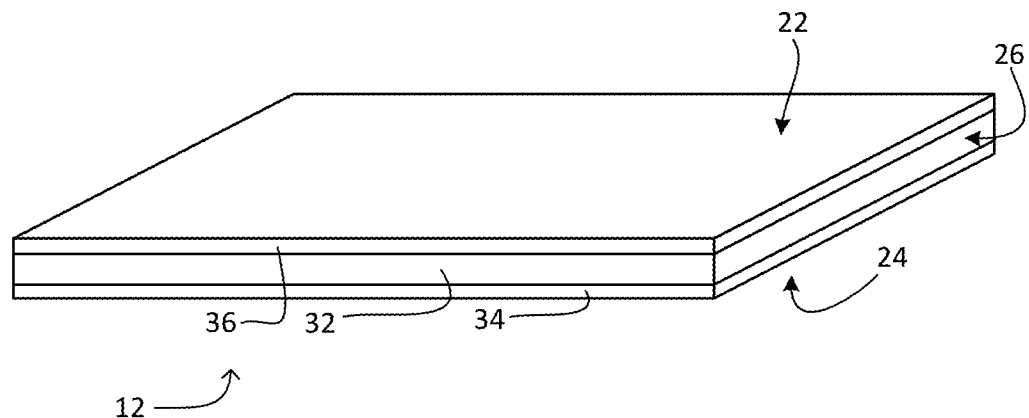
FIG. 1 is a perspective view of a fused glass laminate sheet useful in methods of the present disclosure.

Additional features and advantages will be set forth in the detailed description which follows and will be apparent to those skilled in the art from the description, or recognized by practicing the embodiments as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

For purposes of this disclosure, the term "coupled" (in all of its forms: couple, coupling, coupled, etc.) generally means the joining of two components directly or indirectly to one another. Such joining may be stationary in nature or movable in nature. Such joining may be achieved with the two components and any additional intermediate members being integrally formed as a single unitary body with one another or with the two components. Such joining may be permanent in nature, or may be removable or releasable in nature, unless otherwise stated.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," "essentially", and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

Directional terms as used herein—for example up, down, right, left, front, back, top, bottom—are made only with reference to the figures as drawn and are not intended to imply absolute orientation.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

Figure 2:
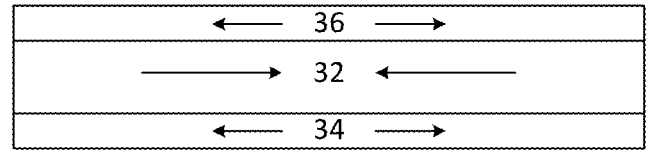
FIG. 2 is a cross-sectional view of the sheet or a portion of the sheet of FIG. 1.
Figure 3:
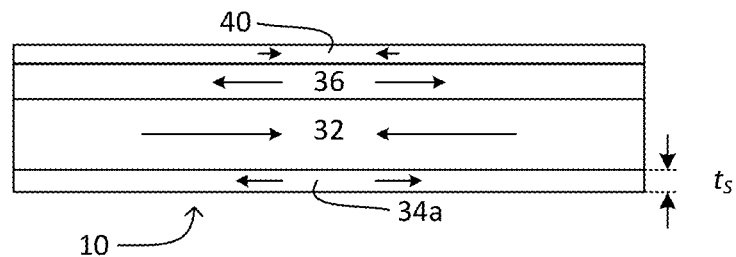
FIG. 3 is a cross-sectional view of the sheet or portion of sheet of FIG. 2 after addition of high CTE layers and thinning of the backside clad layer.

With reference to FIGS. 1-3, the present disclosure provides a method of eliminating or reducing in-process warp in fan-out packaging processes by using a laminated glass sheet or wafer 12 as a carrier and reducing, slightly, the thickness of the backside clad layer. Specifically, first, we choose two compatible compositions with different CTE (coefficient of thermal expansion) values (may be slightly different and or very different), with the core CTE higher than the clad CTE. Note that determination of CTE for purposes of this disclosure is defined as a mean coefficient of linear thermal expansion (CTE) of the glass material according to the dilatometer method of ASTM E228. After production of the laminate sheet 12, such as by Corning's laminate fusion draw technology, a well-defined residual stress exists in the clad and core: a compressive stress inside the clad and tensile stress in the core.

As shown in FIG. 1, the laminate sheet or wafer (defined as a wafer-shaped laminate sheet) 12 comprises a core layer 32 and a first clad layer 34 and a second clad layer 36. An outer surface 22 of the second clad layer 22 is used for attaching one or more semiconductor devices for the purpose of preparing fan-out electrical connections/interconnections. An outer surface 24 of the first clad layer 34 (the "backside" of the laminate sheet or wafer 12) is thinned to provide reduced warp during fan-out processing as described below.

As shown in FIG. 2, the first clad layer 34 and the second clad layer 36 are in compression, and accordingly produce a compression resisting force (a restoring force) in the direction indicated generally by the arrows shown on layers 34, 36, while the core layer 32 is in tension and accordingly produces a tension resisting force (a restoring force) in the direction indicated generally by the arrows shown on layer 32.

As shown in FIG. 3, additional layer(s) 40—including electronic devices and dielectric layer/layers (for example, polyimide, polybenzoxazole, benzocylobutene and the like) and copper traces are deposited on the second clad layer 36. Because the dielectric layer or layers, and the copper traces in particular, typically have higher CTEs than the laminate sheet or wafer 12 (and the initial portions of additional layer(s) 40, and also since these dielectric and metal layers are deposited at elevated temperature, the resulting stress after cooling is tensile stress is the additional layer(s), with a restoring force produced by the additional layer(s) in the general direction of the arrows shown on layer(s) 40. To balance the various restoring forces and allow the total structure to have reduced warp, the first clad layer is thinned, such as by etching or polishing or grinding or a combination of these, or by other suitable means, to produce thinned first clad layer 34a. Thus flatness or low warp can be restored after deposition of one or more fan-out layers.

Figure 4:
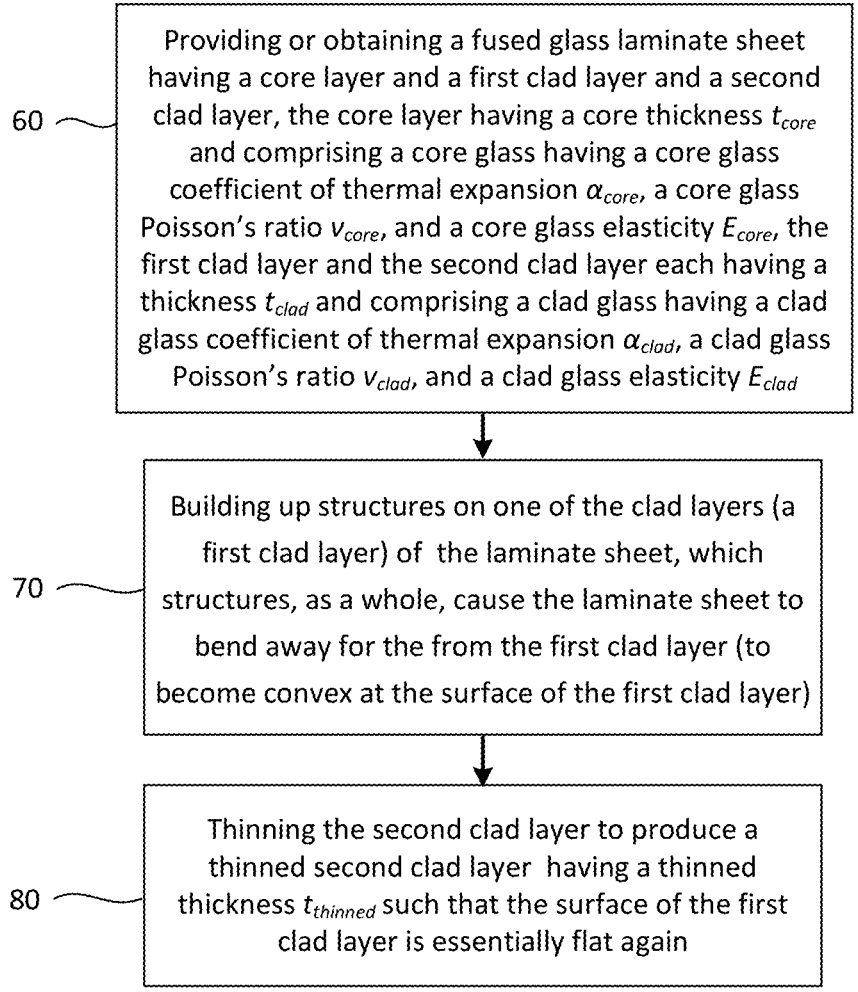
FIG. 4 is a flow chart of embodiments of some methods according to the present disclosure.

Embodiments of this process are represented in the flow chart of FIG. 4 as process 50 having the steps 60, 70 and 80 as shown. In step 60, a fused glass laminate sheet having a core layer and a first clad layer and a second clad layer is provided or obtained. The core layer has a core thickness $t_{core}$ and comprises a core glass having a core glass coefficient of thermal expansion $\alpha_{core}$, a core glass Poisson's ratio $v_{core}$, and a core glass elasticity $E_{core}$. The first clad layer and the second clad layer each have a thickness $t_{clad}$ and comprise a clad glass having a clad glass coefficient of thermal expansion $\alpha_{clad}$, a clad glass Poisson's ratio $v_{clad}$, and a clad glass elasticity $E_{clad}$. In step 70, structures (such as fan-out structures) are then built up on one of the clad layers (on the first clad layer, in this description) of the laminate sheet, which structures, as a whole, cause the laminate sheet to bend away for the from the first clad layer (to become convex at the surface of the first clad layer). In step 80, the second clad layer is thinned to produce a thinned second clad layer having a thinned thickness $t_{thinned}$ such that the surface of the first clad layer is essentially flat again.

Figure 5:
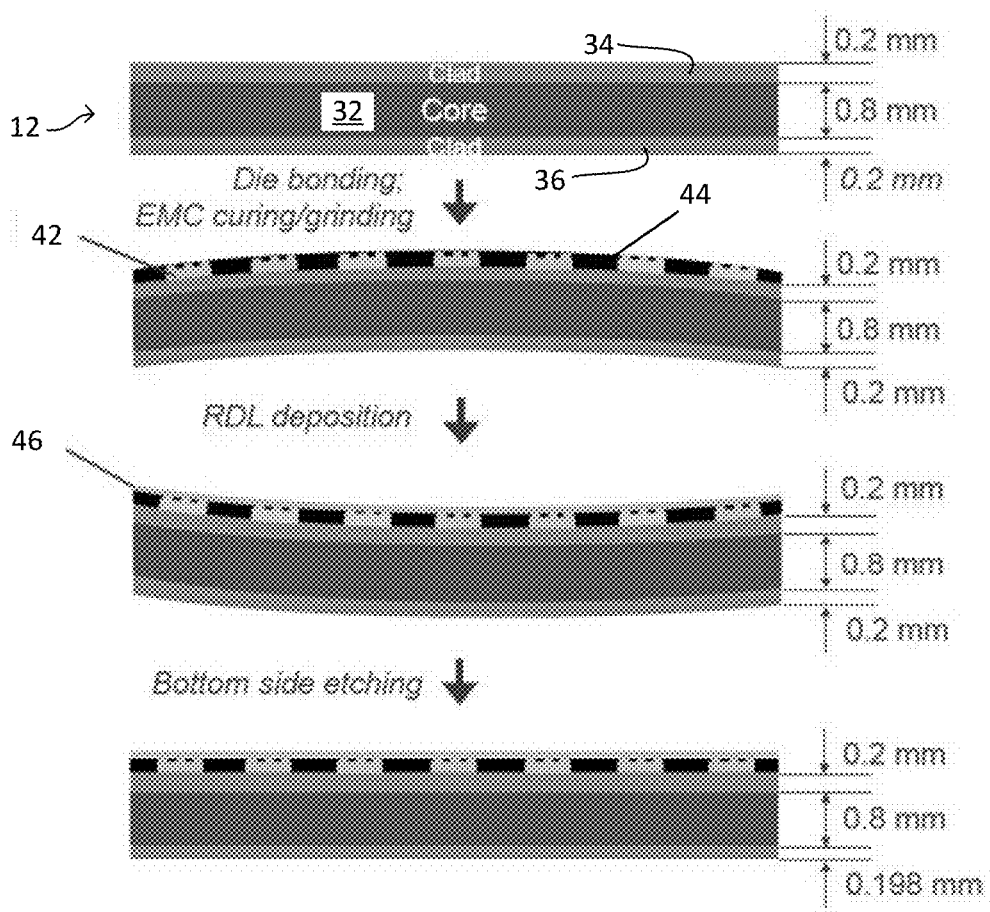
FIG. 5 is a cross-sectional diagram illustrating embodiments of the steps of the methods of FIG. 4.

In a more specifically described version of the method of FIG. 4, a method of fan-out processing is provided, with the method comprising (1) providing or obtaining a fused glass laminate sheet or wafer 12 having a core layer 32 and a first clad layer 34 and a second clad layer 36, the core layer 32 comprising a core glass having a core glass coefficient of thermal expansion $\alpha_{core}$, the first clad layer 34 and the second clad layer 36 each comprising a clad glass having a clad glass coefficient of thermal expansion $\alpha_{clad}$, where $\alpha_{clad} > \alpha_{core}$; (2) affixing integrated circuit devices 42 to the second clad layer 36 of the laminate sheet or wafer; (3) forming a fan-out layer 46 on or above the integrated circuit devices 42; and (4) removing some of the first clad layer 34 to decrease warp of the sheet or wafer with integrated circuit devices and a fan-out layer thereon. FIG. 5 shows a diagrammatic cross-sectional illustration of this method.

In FIG. 5, glass laminate sheet or wafer 12 has a core layer 32 and a first clad layer 34 and a second clad layer 36, with an affective CTE of the laminate 12 selected to produce no warp, or, as shown, even a little downward (sad face) warp after die bonding (affixing of integrated circuit components 42) and filling of the spaces between the dies (integrated circuit components) with epoxy 44 (epoxy molding compound or "EMC") with curing of the epoxy followed by grinding to level it. When one or more fan-out layers 46 (RDLs or redistribution layers) are then deposited on and/or above the integrated circuit components 42, upward warp (happy face) is produced. By etching a very thin layer of the bottom (non-deposition) side of the laminate (etching the surface 24 of the first clad layer 34), this in-process upward warp can be reduced or eliminated, or, if desired for further processing, even brought again to a little downward (sad face) warp.

The effective CTE of the laminate at the start is desirably selected to be close to the optimized CTE for the manufacturing process up through the die bonding and EMC (epoxy molding compound) curing/grinding process only. Major factors include EMC modulus/CTE/curing temperature, die form factors, and the die occupancy ratio. The effective CTE of the laminate, thus selected, is lower than the effective CTE of the laminate which would be optimal over the whole fan-out process. The ability to use lower effective CTE to start provides an advantage in one aspect, since it is often difficult to obtain a glass, and thus a glass laminate, with high CTE (e.g., greater than 9-10 ppm/° C. or more) and high stiffness simultaneously.

Figure 6:
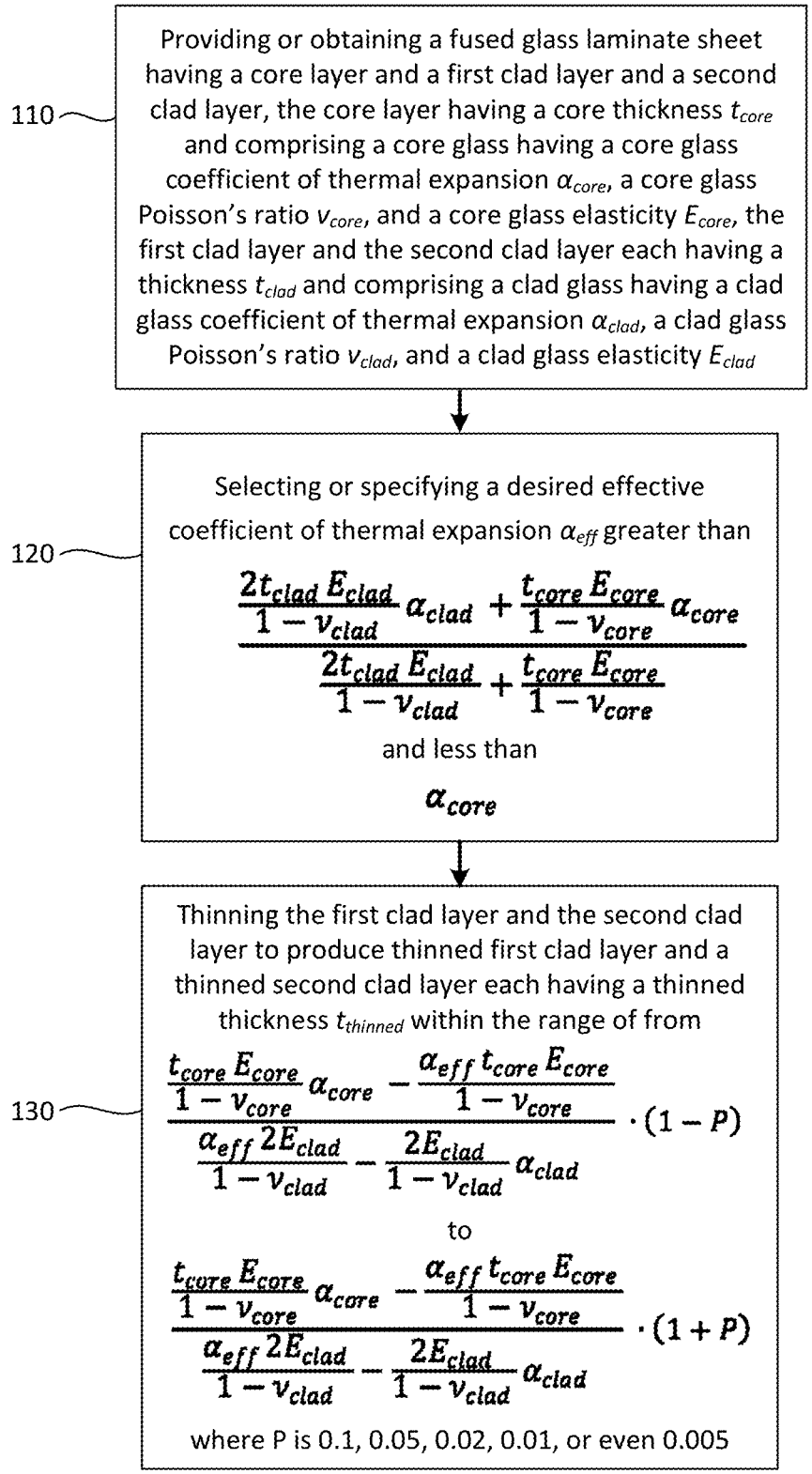
FIG. 6 is a flow chart of embodiments of additional method steps optionally useful in conjunction with the methods of FIG. 4.

According to further embodiments, selecting the specific effective CTE of the laminate sheet or wafer can further comprise the method 100 comprising the steps 110-130 as shown in the flowchart of FIG. 6, or, in more specific words, the steps of (1) providing or obtaining a fused glass laminate having a core layer (32) and a first clad layer (34) and a second clad layer (36), the core layer (32) having a core thickness $t_{core}$ and comprising a core glass having a core glass coefficient of thermal expansion $\alpha_{core}$, a core glass Poisson's ratio $v_{core}$, and a core glass elasticity $E_{core}$, the first clad layer (34) and the second clad layer (36) each having a thickness $t_{clad}$ and comprising a clad glass having a clad glass coefficient of thermal expansion $\alpha_{clad}$, a clad glass Poisson's ratio $v_{clad}$, and a clad glass elasticity $E_{clad}$, (2) selecting a desired effective coefficient of thermal expansion $\alpha$eff greater than $$\frac{\frac{2t_{clad}E_{clad}}{1-v_{clad}}\alpha_{clad} + \frac{t_{core}E_{core}}{1-v_{core}}\alpha_{core}}{\frac{2t_{clad}E_{clad}}{1-v_{clad}} + \frac{t_{core}E_{core}}{1-v_{core}}}$$

and less than $\alpha_{core}$, and thinning the first clad layer (34) and the second clad layer (36) to produce thinned first clad layer (34a) and a thinned second clad layer (36a) each having a thickness trimmed within the range of from $$\frac{\frac{t_{core}E_{core}}{1-v_{core}}\alpha_{core} - \frac{\alpha_{eff}t_{core}E_{core}}{1-v_{core}}}{\frac{\alpha_{eff}2E_{clad}}{1-v_{clad}} - \frac{2E_{clad}}{1-v_{clad}}\alpha_{clad}} \cdot (1-P)$$

to $$\frac{\frac{t_{core}E_{core}}{1-v_{core}}\alpha_{core} - \frac{\alpha_{eff}t_{core}E_{core}}{1-v_{core}}}{\frac{\alpha_{eff}2E_{clad}}{1-v_{clad}} - \frac{2E_{clad}}{1-v_{clad}}\alpha_{clad}} \cdot (1+P)$$

where P is 0.1, 0.05, 0.02, 0.01, or even 0.05.

In further embodiments of the methods shown in FIG. 6, the core layer consists essentially of the core glass. In additional further embodiments, the first clad layer and the second clad layer each consist essentially of the clad glass.

In still further embodiments, the step of providing or obtaining a fused glass laminate sheet comprises producing the fused glass laminate sheet using a fusion draw machine.

In still other embodiments, the step of thinning the first clad layer and the second clad layer comprises etching the first clad layer and the second clad layer.

In yet other embodiments, the step of thinning the first clad layer and the second clad layer comprises polishing the first clad layer and the second clad layer.

According to further embodiments, the method further comprises the step of cutting the fused glass laminate sheet to form one or more wafers.

According to still further embodiments, the method comprises the step of cutting the fused glass laminate sheet to form one or more panels.

According to yet further embodiments, cutting comprises laser cutting.

According to additional further embodiments, cutting comprises laser cutting using a Bessel beam.

Since in the methods of FIG. 4 or 5, the selected starting effective CTE of the laminate is optimized for die bonding and EMC curing/grinding only, warp produced during these steps is small. Either flat or only slightly bending downward (away from the process face) (sad face) warp, as shown in FIG. 5, can be achieved by carefully choosing the starting CTE.

With deposition of each additional layer after die bonding and EMC curing/grinding, the effective CTE of the above-carrier layers generally keeps increasing, since both dielectric layer/layers (e.g. polyimide, polybenzoxazole, benzocyclobutene) and copper traces have higher CTEs than EMC. Since these additional layers are deposited at elevated temperature, the resulting stress after cooling is tensile stress is the additional layers, resulting in warp toward the process face (happy face). If this warp is not compensated, the carrier and the device layers together will keep bending upward (toward the process face), and may go outside the process specifications. However, according to the method and processes disclosed herein, upward warp after die bonding and EMC curing/grinding is compensated by etching and/or polishing the bottom side of the carrier.

During the entire fan-out deposition/packaging process, the wafer/panel needs to go through many chambers for different process steps. Between transfers, the wafer/panel is de-attached from the vacuum chuck, and mechanical/chemical etching/polishing on the bottom side of the carrier can be performed in between chambers with minimal impact on the deposition/packaging process. The number of etching/polishing steps will be determined by the process specification and/or the RDL (redistribution layer) requirement(s).

In current commercial practice, glass carriers are typically recycled multiple times. In the present method, optionally, after each use, a top (deposition) side etching can be performed to reduce the thickness of the first clad layer and return the carrier to a flat shape. This can be combined with the cleaning steps already in place. Since only a very thin layer of clad (1~2 um) is etched away for a complete cycle, the carrier thickness will not be reduced very significantly, even after multiple usages, and pre-use effective CTE of the recycled carrier laminate will change (decrease) only slowly. If desired, the initial effective CTE of a carrier laminate intended for multiple use may be selected to be slightly higher than the ideal CTE for the die bonding and EMC curing/grinding steps taken alone, to facilitate extending the feasible number of recyclings. In case a large number of recyclings is not feasible, for high end packages where very small lithography linewidth (<1 um) is required, the ability to tightly control warp is expected to outweigh the disadvantage of reduced or absent recycling.

While exemplary embodiments and examples have been set forth for the purpose of illustration, the foregoing description is not intended in any way to limit the scope of disclosure and appended claims. Accordingly, variations and modifications may be made to the above-described embodiments and examples without departing substantially from the spirit and various principles of the disclosure. All such modifications and variations are intended to be included herein within the scope of this disclosure and protected by the following claims.

What is claimed is:

1. A method of fan-out processing, the method comprising:
affixing integrated circuit devices to a second clad layer of a glass laminate sheet or wafer, the glass laminate sheet or wafer having a core layer with a first clad layer and the second clad layer each fused to the core layer, the core layer comprising a core glass having a core glass coefficient of thermal expansion (CTE) $\alpha_{core}$, the first clad layer and the second clad layer each comprising a clad glass having a clad glass CTE $\alpha_{clad}$, where $\alpha_{clad} < \alpha_{core}$;
forming a first fan-out layer on or above the integrated circuit devices; and
removing some of the first clad layer to decrease warp of the sheet or wafer with integrated circuit devices and a fan-out layer thereon.

2. The method according to claim 1 wherein the core layer consists essentially of the core glass.

3. The method according to claim 1 wherein the first clad layer and the second clad layer each consist essentially of the clad glass.

4. The method according to claim 1 wherein the step of providing or obtaining a fused glass laminate sheet or wafer comprises producing the fused glass laminate using a fusion draw machine.

5. The method according to claim 1 wherein the step of removing some of the first clad layer comprises etching the first clad layer.

6. The method according to claim 1 wherein the step of removing some of the first clad layer comprises polishing or grinding the first clad layer.

7. The method according to claim 1 further comprising selecting an effective CTE of the laminate sheet or wafer based on the core glass CTE $\alpha_{core}$ and the clad glass CTE $\alpha_{clad}$ to be within 20% of an ideal CTE for decreasing warpage during die bonding and filling processes only.

8. The method according to claim 1 further comprising selecting an effective CTE of the laminate sheet or wafer based on the core glass CTE $\alpha_{core}$ and the clad glass CTE $\alpha_{clad}$ to be within 10% of an ideal CTE for decreasing warpage during die bonding and filling processes only.

9. The method according to claim 1 further comprising:
forming an additional fan-out layer on or above the first fan-out layer and removing more of the first clad layer.

10. The method according to claim 7 wherein the core layer has a core thickness $t_{core}$ and the core glass has a core glass Poisson's ratio $v_{core}$ and a core glass elasticity $E_{core}$, the first clad layer and the second clad layer each have a thickness $t_{clad}$ and the clad glass has a clad glass Poisson's ratio $v_{clad}$ and a clad glass elasticity $E_{clad}$; and
wherein the step of selecting the effective CTE of the laminate sheet or wafer further comprises:
selecting the effective CTE $\alpha_{eff}$ to be greater than $$\frac{\dfrac{2t_{clad}E_{clad}}{1-v_{clad}}\alpha_{clad} + \dfrac{t_{core}E_{core}}{1-v_{core}}\alpha_{core}}{\dfrac{2t_{clad}E_{clad}}{1-v_{clad}} + \dfrac{t_{core}E_{core}}{1-v_{core}}}$$

and less than $\alpha_{core}$, and thinning the first clad layer and the second clad layer to produce thinned first clad layer and a thinned second clad layer each having a thickness $t_{thinned}$ within the range of from $$\frac{\dfrac{t_{core}E_{core}}{1-v_{core}}\alpha_{core} - \dfrac{\alpha_{eff}t_{core}E_{core}}{1-v_{core}}}{\dfrac{\alpha_{eff}2E_{clad}}{1-v_{clad}} - \dfrac{2E_{clad}}{1-v_{clad}}\alpha_{clad}} \cdot (1-P)$$

to $$\frac{\dfrac{t_{core}E_{core}}{1-v_{core}}\alpha_{core} - \dfrac{\alpha_{eff}t_{core}E_{core}}{1-v_{core}}}{\dfrac{\alpha_{eff}2E_{clad}}{1-v_{clad}} - \dfrac{2E_{clad}}{1-v_{clad}}\alpha_{clad}} \cdot (1+P)$$

where P is 0.1, 0.05, 0.02, 0.01, or 0.005.

* * * * *